(12) United States Patent
Hartman et al.

(10) Patent No.: US 8,791,367 B2
(45) Date of Patent: Jul. 29, 2014

(54) NETWORK CABINET FITTING SYSTEM

(75) Inventors: Scott R. Hartman, Oak Forest, IL (US); Dale A. Block, Schererville, IN (US); Edward G. Blomquist, Plainfield, IL (US); Scott M. Lesniak, Lockport, IL (US)

(73) Assignee: Panduit Corp., Tinley Park, IL (US)

( * ) Notice: Subject to any disclaimer, the term of this patent is extended or adjusted under 35 U.S.C. 154(b) by 449 days.

(21) Appl. No.: 12/902,861

(22) Filed: Oct. 12, 2010

(65) Prior Publication Data

US 2011/0083873 A1   Apr. 14, 2011

Related U.S. Application Data

(60) Provisional application No. 61/251,429, filed on Oct. 14, 2009.

(51) Int. Cl.
| | | |
|---|---|---|
| *H01B 17/26* | (2006.01) | |
| *H04Q 1/10* | (2006.01) | |
| *H05K 7/14* | (2006.01) | |
| *H04Q 1/06* | (2006.01) | |
| *H02G 3/22* | (2006.01) | |

(52) U.S. Cl.
CPC . *H02G 3/22* (2013.01); *H04Q 1/10* (2013.01); *H05K 7/1491* (2013.01); *H04Q 1/06* (2013.01)
USPC .................................................... 174/152 G

(58) Field of Classification Search
USPC ......... 174/50, 59, 153, 152 G, 664, 650, 142, 174/135, 151, 66, 67, 152 R, 153 G; 385/136, 138; 16/2.1, 2.2; 248/56, 73, 248/27.1; 403/167, 230, 238; 52/211
See application file for complete search history.

(56) References Cited

U.S. PATENT DOCUMENTS

| | | | |
|---|---|---|---|
| 3,951,228 A | | 4/1976 | Schnell |
| 4,403,106 A | | 9/1983 | Lask et al. |
| 4,432,520 A | * | 2/1984 | Simon ............................ 248/56 |
| 4,656,689 A | * | 4/1987 | Dennis ............................ 16/2.2 |
| 4,688,491 A | * | 8/1987 | Herrera et al. ............. 108/50.02 |
| 4,717,358 A | * | 1/1988 | Chaundy ....................... 439/557 |
| 4,730,363 A | | 3/1988 | Asbaghi |
| 4,731,501 A | | 3/1988 | Clark et al. |
| D298,494 S | | 11/1988 | Mockett |
| 4,814,547 A | | 3/1989 | Riley et al. |
| 4,864,080 A | | 9/1989 | Fochler et al. |
| 4,928,349 A | | 5/1990 | Oikawa et al. |

(Continued)

FOREIGN PATENT DOCUMENTS

| | | |
|---|---|---|
| DE | 4326242 A1 | 2/1995 |
| DE | 10027486 A1 | 12/2001 |
| GB | 2262397 A | 6/1993 |
| WO | 2009142885 A1 | 11/2009 |

*Primary Examiner* — Boris Chervinsky
*Assistant Examiner* — Pete Lee
(74) *Attorney, Agent, or Firm* — Christopher S. Clancy; James H. Williams

(57) ABSTRACT

A fitting system for sealing an opening in a top cap of a network cabinet includes a grommet and at least one of a fitting assembly and a cover. The grommet is secured to the opening in the top cap of the network cabinet. The fitting assembly and the cover are secured to the grommet and may include at least one finger lift. A sleeve or a tube may be secured to the fitting assembly.

18 Claims, 18 Drawing Sheets

(56) References Cited

U.S. PATENT DOCUMENTS

| | | | |
|---|---|---|---|
| 5,101,079 A | 3/1992 | Rodrigues et al. | |
| 5,113,475 A | 5/1992 | Baker | |
| 5,167,047 A | 12/1992 | Plumley | |
| 5,170,008 A | 12/1992 | Evans et al. | |
| 5,254,808 A | 10/1993 | Rodrigues et al. | |
| D355,110 S * | 2/1995 | Olson et al. | D8/356 |
| 5,442,140 A * | 8/1995 | McGrane | 174/151 |
| 5,546,495 A | 8/1996 | Bruckner et al. | |
| 5,589,663 A | 12/1996 | Wales | |
| 5,675,124 A | 10/1997 | Stough et al. | |
| 5,686,700 A | 11/1997 | Carpinella | |
| 5,696,351 A | 12/1997 | Benn et al. | |
| 5,732,180 A | 3/1998 | Kaplan | |
| 5,806,140 A | 9/1998 | Carlson et al. | |
| 5,860,713 A * | 1/1999 | Richardson | 312/223.6 |
| 5,886,300 A | 3/1999 | Strickler | |
| 5,908,180 A * | 6/1999 | Daoud | 248/56 |
| 5,959,250 A | 9/1999 | Daoud | |
| 6,015,197 A | 1/2000 | DiGiacomo et al. | |
| 6,044,193 A | 3/2000 | Szentesi et al. | |
| 6,162,989 A | 12/2000 | Garner | |
| 6,194,659 B1 | 2/2001 | Cornu | |
| 6,248,952 B1 | 6/2001 | Reeves et al. | |
| 6,263,634 B1 | 7/2001 | Bodnar et al. | |
| 6,351,592 B1 | 2/2002 | Ehn et al. | |
| 6,376,777 B1 | 4/2002 | Ito et al. | |
| 6,383,034 B1 | 5/2002 | Blake et al. | |
| 6,393,658 B1 | 5/2002 | Chong | |
| 6,554,697 B1 * | 4/2003 | Koplin | 454/184 |
| 6,686,540 B2 * | 2/2004 | Compagnone, Jr. | 174/58 |
| 6,694,566 B1 | 2/2004 | Mockett | |
| 6,776,707 B2 | 8/2004 | Koplin | |
| 6,877,184 B2 | 4/2005 | Mockett | |
| 6,950,593 B2 | 9/2005 | Hodge et al. | |
| 6,995,316 B1 * | 2/2006 | Goto | 174/659 |
| 7,010,210 B2 | 3/2006 | Dufour | |
| 7,046,521 B2 | 5/2006 | Garmong | |
| 7,124,468 B2 | 10/2006 | Mockett | |
| 7,155,775 B2 | 1/2007 | Mockett | |
| 7,266,281 B1 | 9/2007 | Flatau | |
| 7,276,659 B2 | 10/2007 | Thrift et al. | |
| 7,293,666 B2 | 11/2007 | Mattlin et al. | |
| D560,114 S | 1/2008 | Mockett | |
| 7,383,610 B2 | 6/2008 | Mockett | |
| 7,388,156 B2 * | 6/2008 | Knagge | 174/152 G |
| 7,496,268 B2 | 2/2009 | Escoto et al. | |
| 7,498,512 B2 * | 3/2009 | Adducci et al. | 174/50 |
| 7,507,912 B1 | 3/2009 | Sempliner et al. | |
| 7,615,714 B2 * | 11/2009 | Pyron et al. | 174/660 |
| 7,668,431 B2 | 2/2010 | Cox et al. | |
| 7,751,676 B2 | 7/2010 | Riley et al. | |
| 7,788,766 B2 * | 9/2010 | Mockett | 16/2.1 |
| 7,871,079 B2 * | 1/2011 | Dukes et al. | 277/616 |
| 8,249,411 B2 * | 8/2012 | Burke | 385/135 |
| 2007/0273256 A1 | 11/2007 | Martin et al. | |
| 2007/0278005 A1 | 12/2007 | Holmberg et al. | |
| 2008/0118216 A1 | 5/2008 | Riley et al. | |
| 2008/0178421 A1 | 7/2008 | Mockett | |
| 2008/0253730 A1 | 10/2008 | Cox et al. | |
| 2009/0151983 A1 | 6/2009 | Sempliner et al. | |
| 2009/0302034 A1 | 12/2009 | Mäkelä et al. | |
| 2010/0148015 A1 | 6/2010 | Matsuno et al. | |
| 2011/0001408 A1 | 1/2011 | Caveney et al. | |

* cited by examiner

NETWORK CABINET FITTING SYSTEM

CROSS-REFERENCE TO RELATED APPLICATIONS

This application claims the benefit of U.S. Provisional Patent Application No. 61/251,429, filed on Oct. 14, 2009, the subject matter of which is incorporated by reference in its entirety.

BACKGROUND OF THE INVENTION

The present invention relates to a network cabinet fitting system. More particularly, the present invention relates to a fitting system for openings in a top cap of a network cabinet.

Typically, network cabinets have knockouts or removable openings of various sizes to allow cables to enter and exit the cabinet. When cables are run in or out of the cabinet, air within the cabinet may escape through the openings and around the cables and adversely affect the cabinet cooling systems.

Therefore, there is a need for a network cabinet fitting system that seals around cables to reduce air leaks.

SUMMARY OF THE INVENTION

A fitting system for sealing an opening in a top cap of a network cabinet. The fitting system includes a grommet and at least one of a fitting assembly and a cover. The grommet is secured to the opening in the top cap of the network cabinet. The fitting assembly and the cover are secured to the grommet and may include at least one finger lift. A sleeve or a tube may be secured to the fitting assembly.

DETAILED DESCRIPTION OF THE PREFERRED EMBODIMENTS

FIGS. 1-7 illustrate a network cabinet fitting system 100 according to a first preferred embodiment of the present invention.

Figure 1:
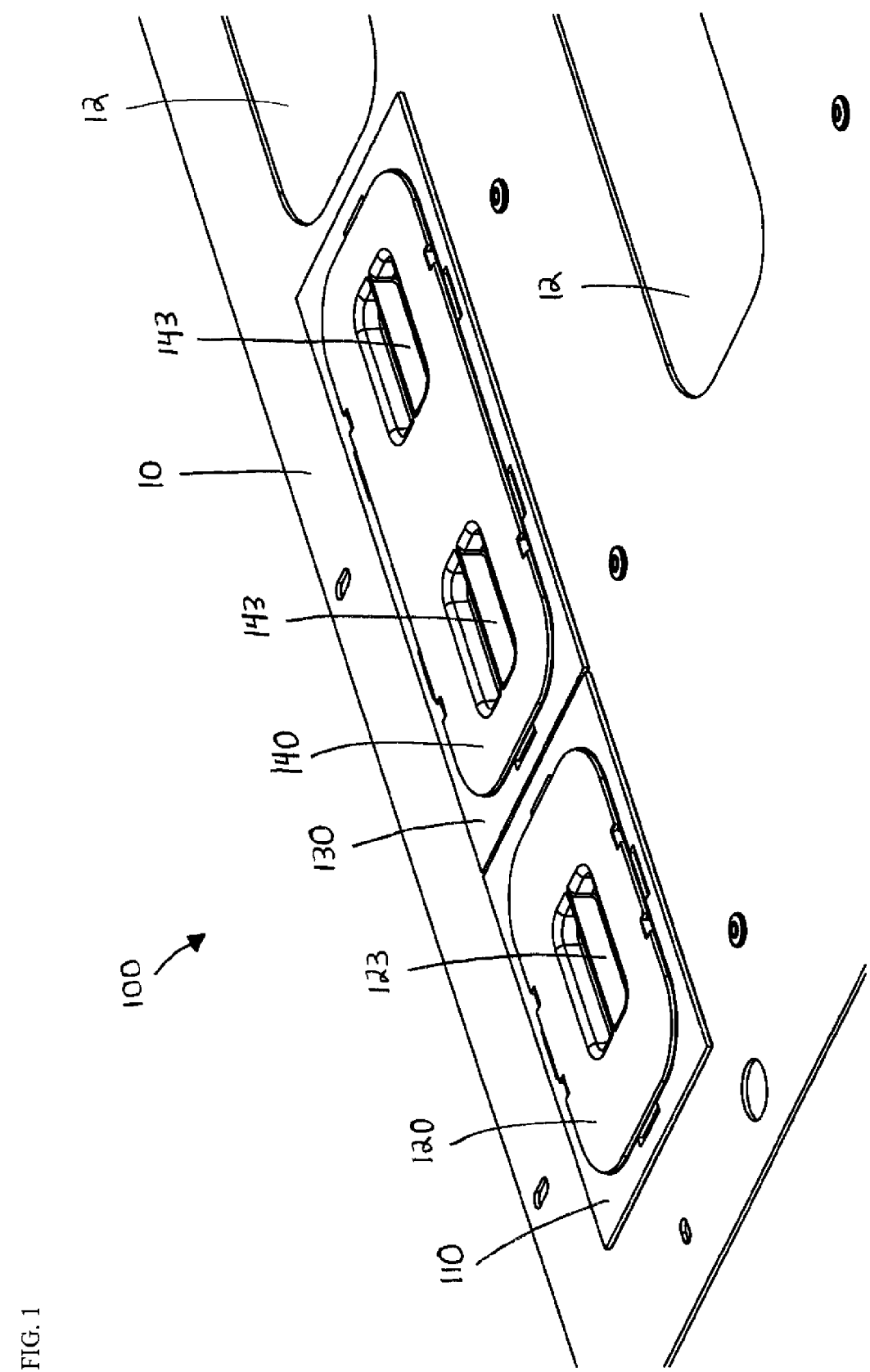
FIG. 1 is a top perspective view of a network cabinet fitting system according to a first preferred embodiment of the present invention.

As best seen in FIG. 1, the fitting system 100 includes a small grommet 110, a small cover 120, a large grommet 130, and a large cover 140.

Figure 2:
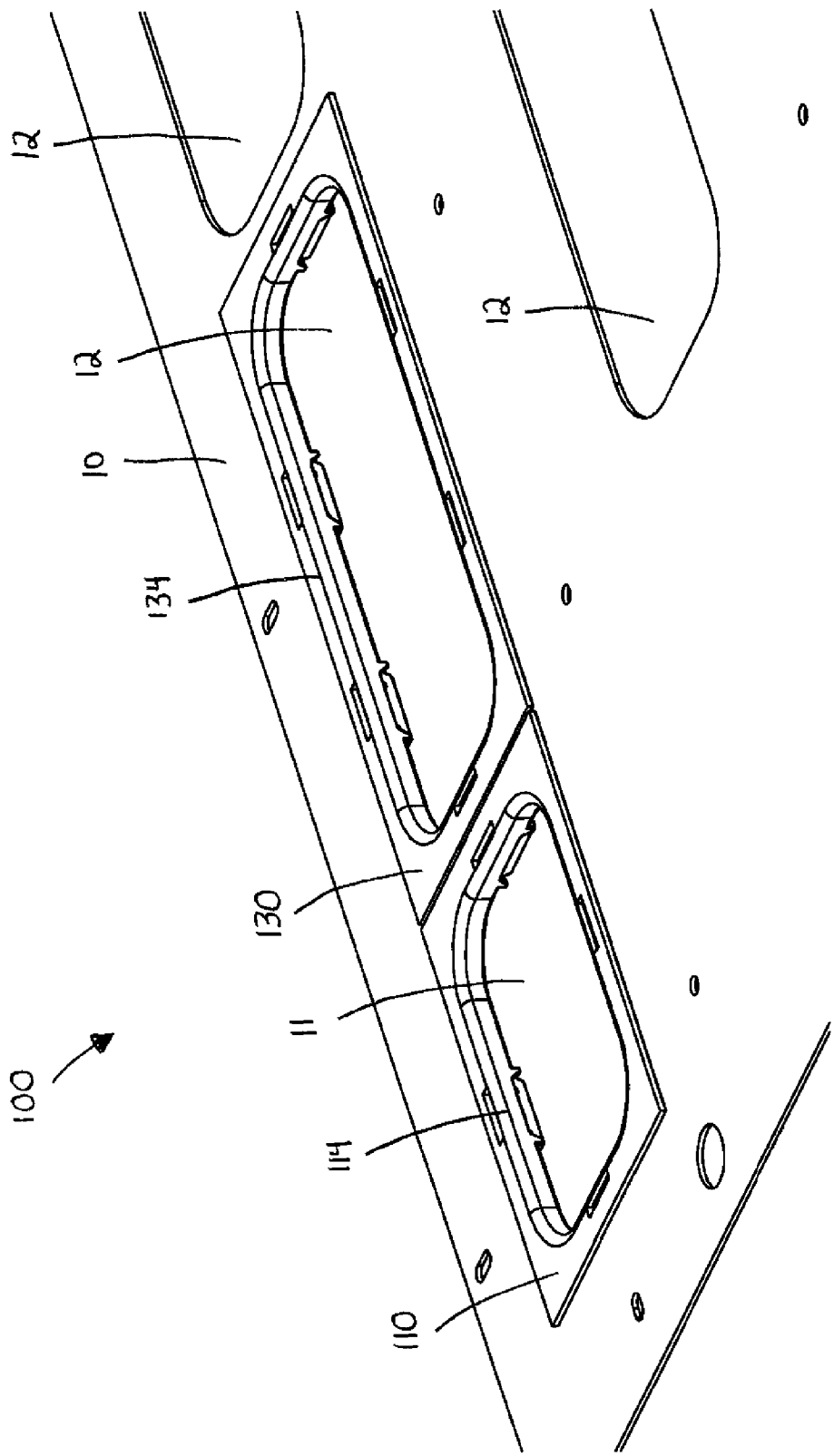
FIG. 2 is a top perspective view of the fitting system of FIG. 1, showing the covers removed from the grommets.

As best seen in FIG. 2, the small grommet 110 is secured to a small opening 11, such as a 3.5 inch by 5.0 inch opening, in a top cap 10 of a network cabinet (not shown), such as the NET-ACCESS™ network cabinet (Panduit Corp., Tinley Park, Ill.) disclosed in U.S. Pat. No. 7,498,512, the subject matter of which is incorporated by reference in its entirety, and includes radius edges 114 for protecting cables routed therethrough. Similarly, the large grommet 130 is secured to a large opening 12, such as a 3.5 inch by 8.0 inch opening, in the top cap 10 and includes radius edges 134 for protecting cables routed therethrough.

Figure 3:
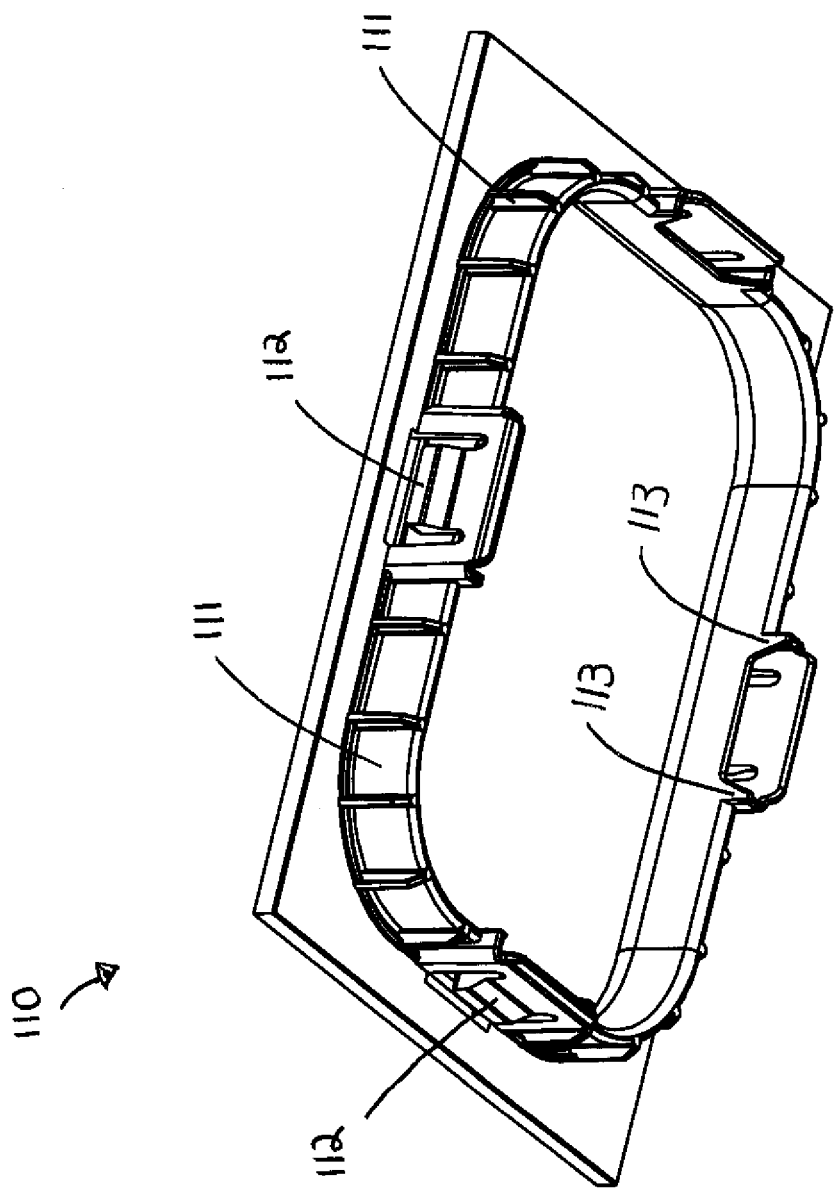
FIG. 3 is a bottom perspective view of a small grommet for the fitting system of FIG. 1.

As best seen in FIG. 3, the small grommet 110 includes guides 111, for inserting the small grommet 110 into the small opening 11 and latches 112 for securing the small grommet 110 to the small opening 11. Additionally, the small grommet 110 includes stops 113 for locating the corrugated tube fitting assembly 350 (FIGS. 12-18).

Figure 4:
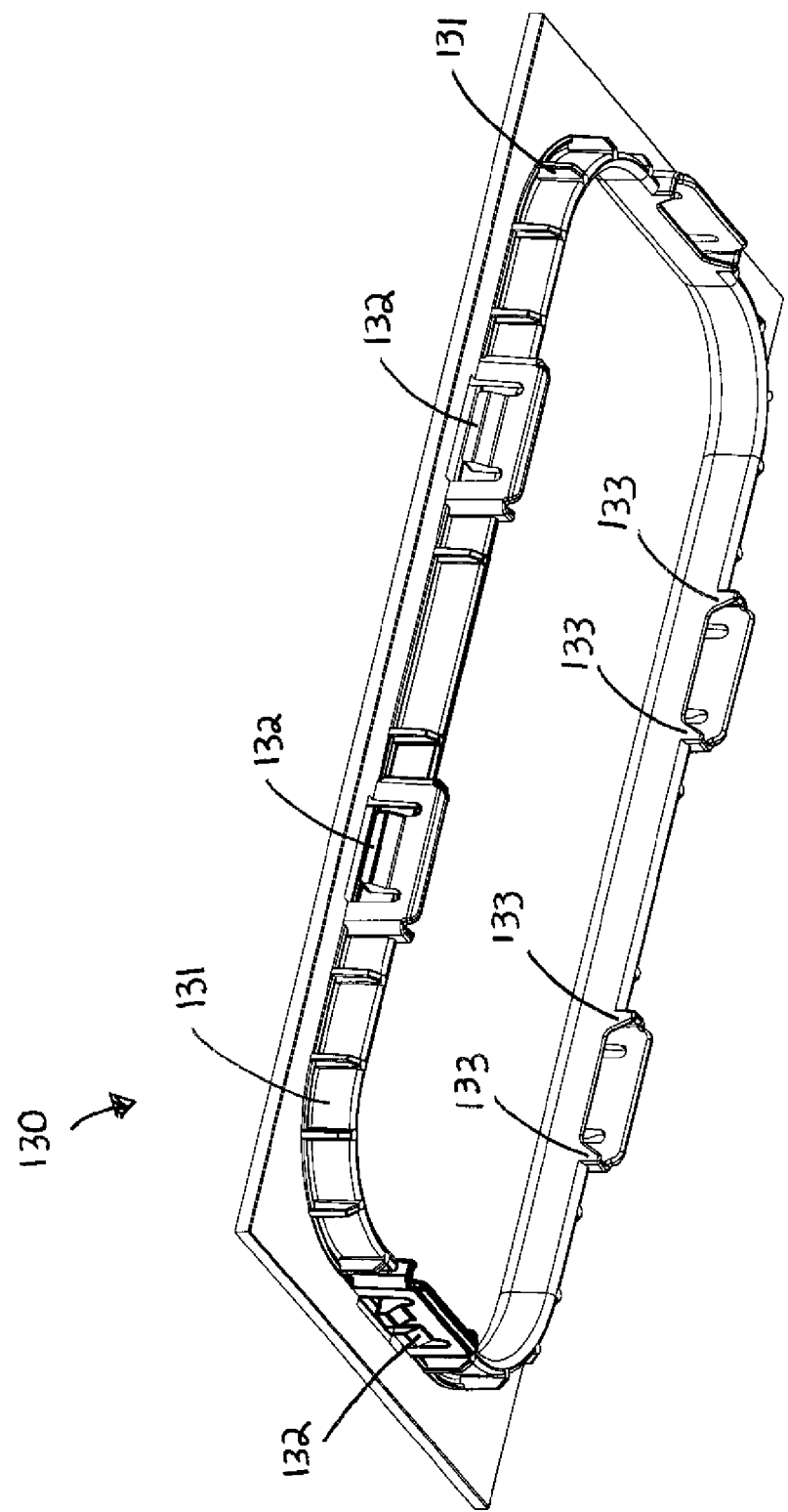
FIG. 4 is a bottom perspective view of a large grommet for the fitting system of FIG. 1.

As best seen in FIG. 4, the large grommet 130 includes guides 131, latches 132, and stops 133, which are similar to the guides 111, latches 112, and stops 113 of the small grommet 110 (FIG. 3).

Figure 5:
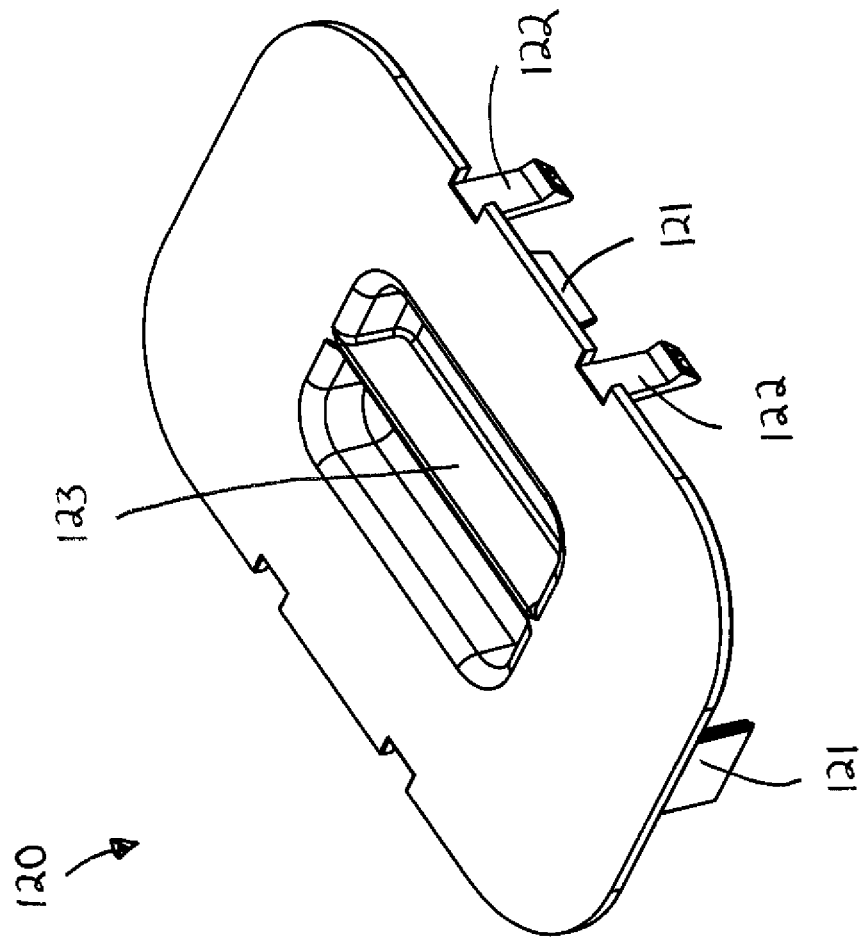
FIG. 5 is a top perspective view of a small cover for the fitting system of FIG. 1.

As best seen in FIG. 5, the small cover 120 includes guides 121 for inserting the small cover 120 into the small grommet 110 and latches 122 for securing the small cover 120 to the small grommet 110. Additionally, the small cover 120 includes a finger lift 123 for removing the small cover 120 from the small grommet 110.

Figure 6:
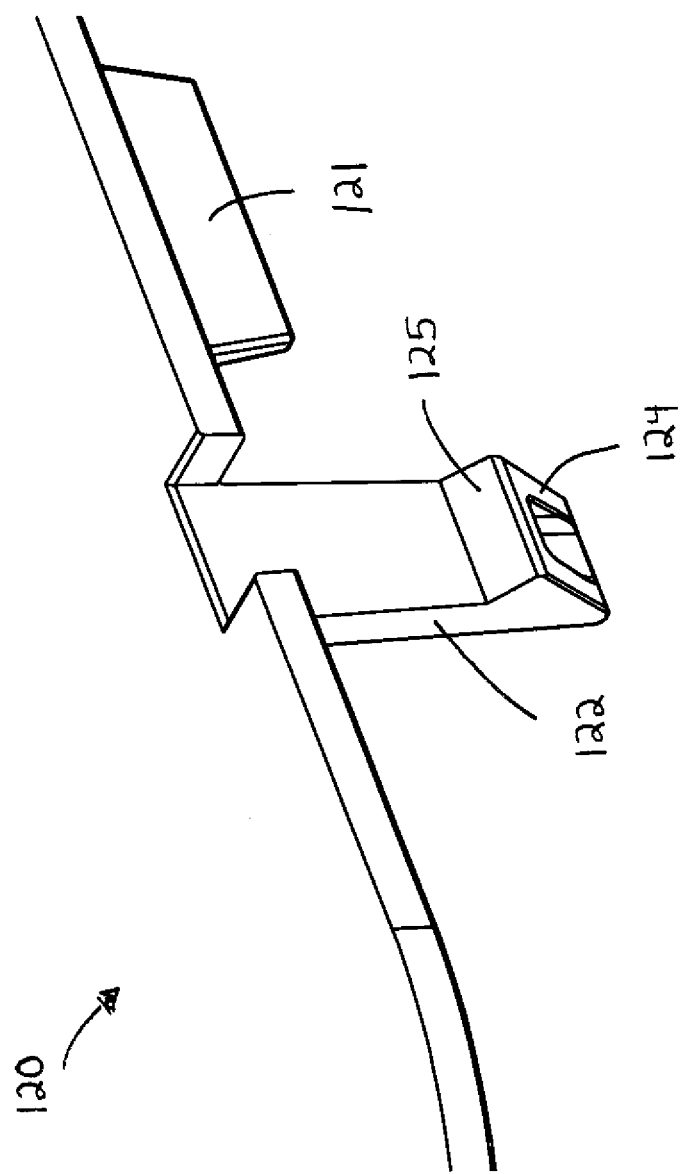
FIG. 6 is an enlarged view of the small cover of FIG. 5, showing a latch.

As best seen in FIG. 6, the latches 122 include a lead-in angle 124 for inserting the small cover 120 into the small grommet 110 and a ramp angle 125 for removing the small cover 120 from the small grommet 110 without having to manually deflect the latches 122.

Figure 7:
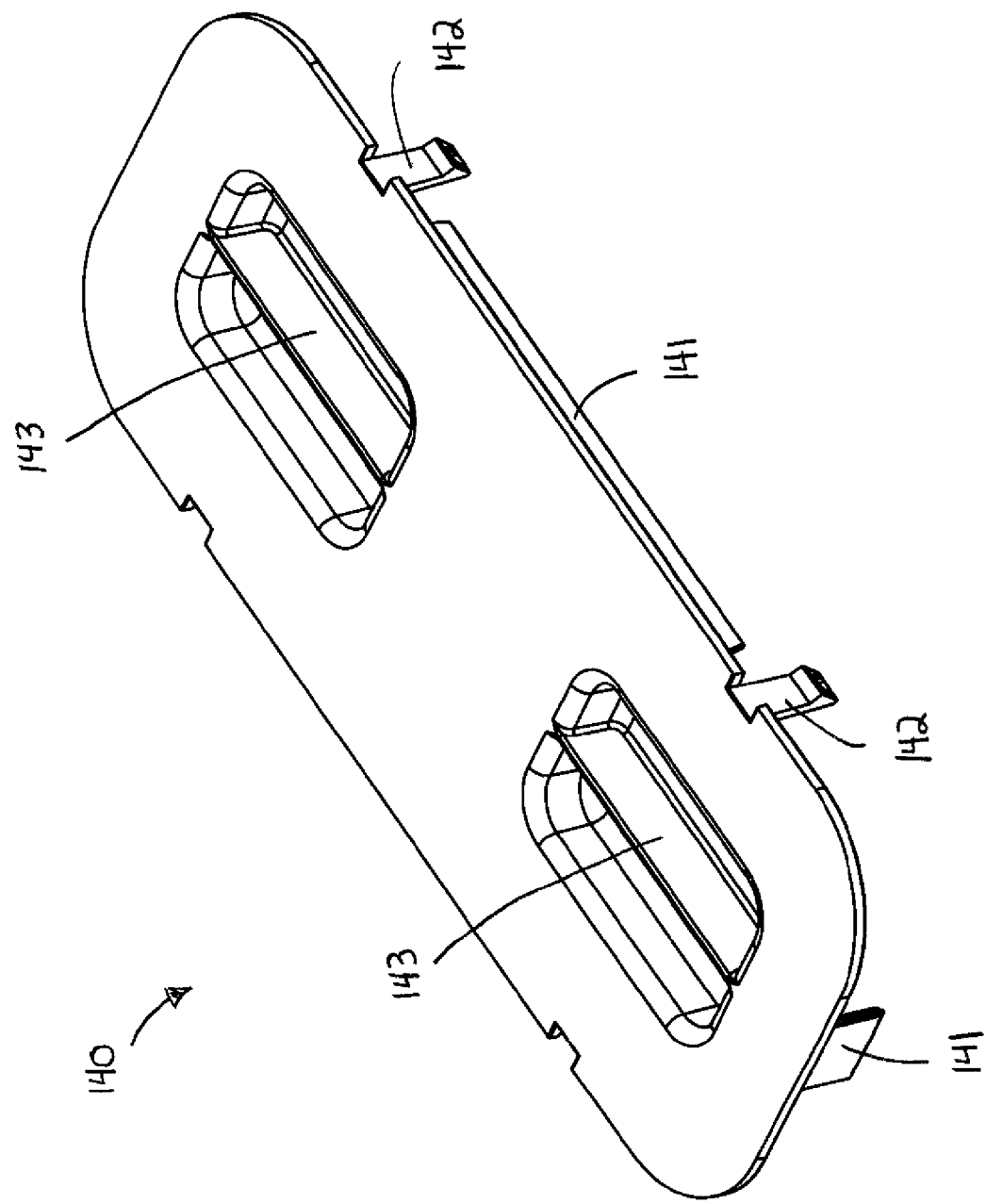
FIG. 7 is a top perspective view of a large cover for the fitting system of FIG. 1.

As best seen in FIG. 7, the large cover 140 includes guides 141, latches 142, and finger lifts 143, which are similar to the guides 121, the latches 122, and the finger lift 123 of the small cover 120 (FIGS. 5-6).

Figure 8:
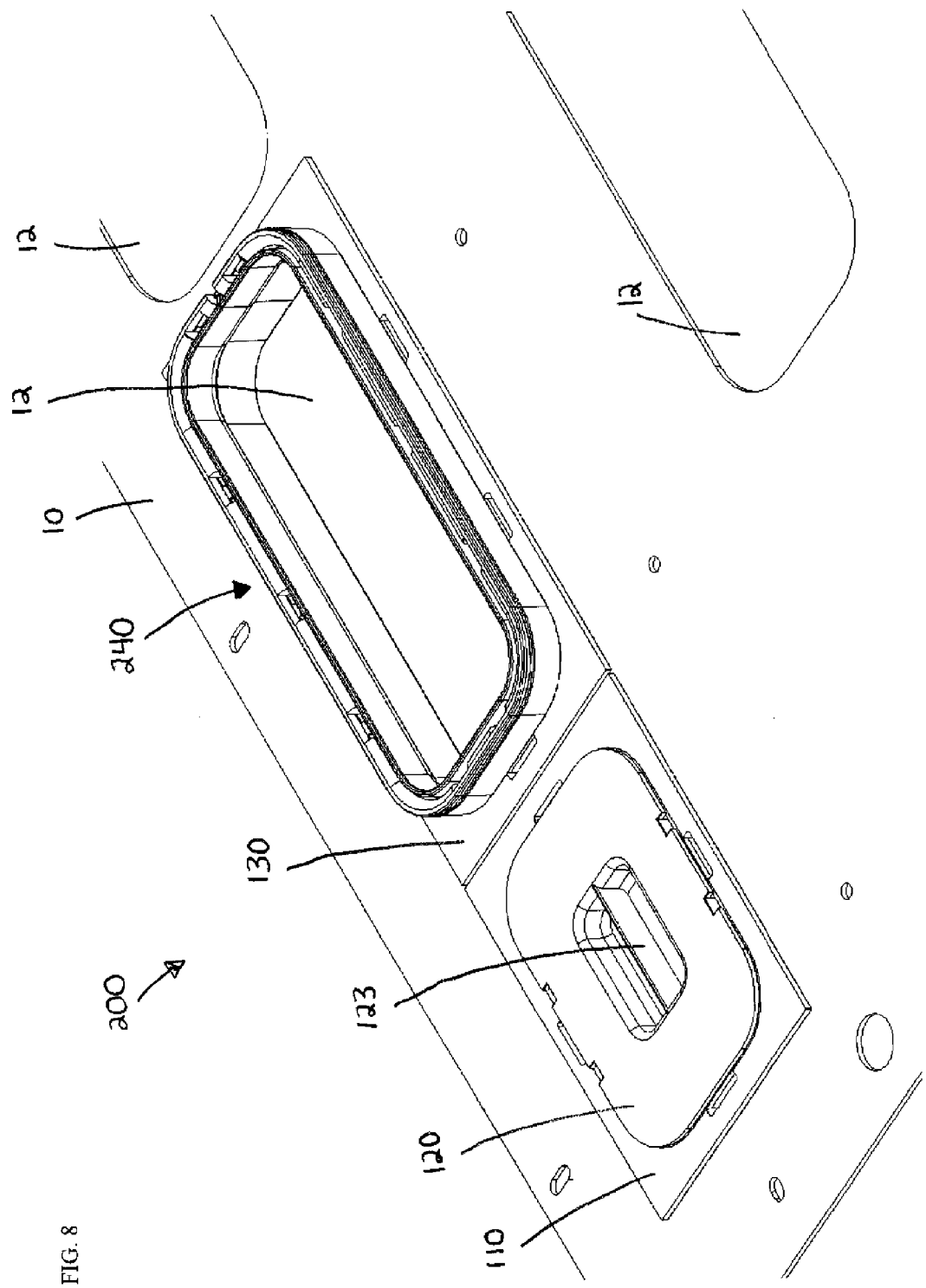
FIG. 8 is a top perspective view of a network cabinet fitting system according to a second preferred embodiment of the present invention.

FIGS. 8-11 illustrate a network cabinet fitting system 200 according to a second preferred embodiment of the present invention. As best seen in FIG. 8, the fitting system 200 includes the small grommet 110, the small cover 120, and the large grommet 130. Additionally, the fitting system 200 includes a boot fitting assembly 240. The boot fitting assembly 240 is secured to the large grommet 130.

Figure 9:
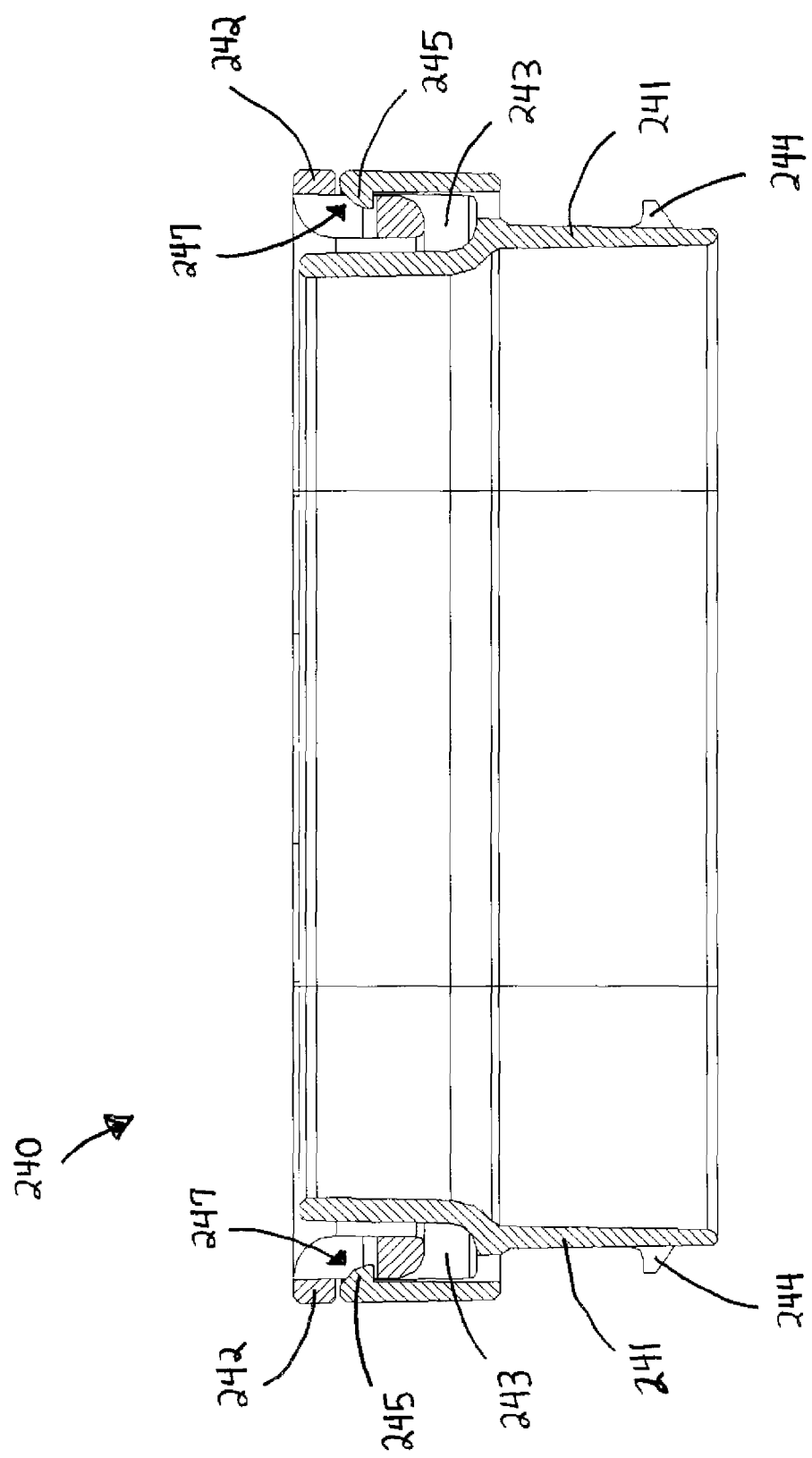
FIG. 9 is a cross-sectional view of a boot fitting assembly for the fitting system of FIG. 8.

As best seen in FIG. 9, the boot fitting assembly 240 includes a first fitting 241 and a second fitting 242. Together, the fittings 241, 242 form a channel 243 for receiving a sleeve (not shown), such as the COOL BOOT™ sleeve (Panduit Corp., Tinley Park, Ill.) disclosed in U.S. Pat. No. 7,723,622, the subject matter of which is incorporated by reference in its entirety.

Figure 10:
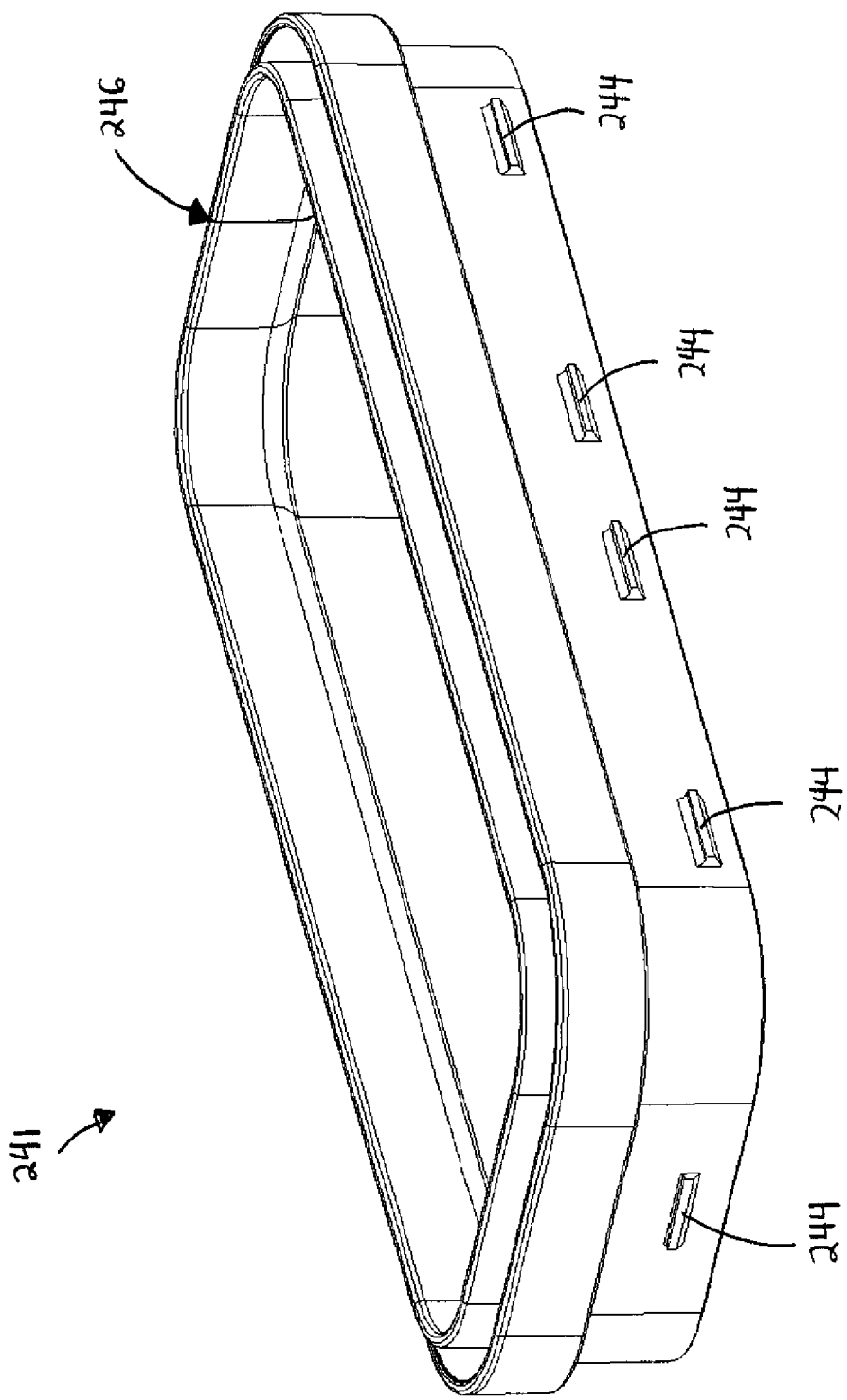
FIG. 10 is a top perspective view of a first fitting for the boot fitting assembly of FIG. 9.

As best seen in FIG. 10, the first fitting 241 includes latches 244 for securing the first fitting 241 to the large grommet 130 and latches 245 (FIG. 9) for securing the second fitting 242 to the first fitting 241. Additionally, the first fitting 241 includes a split 246 for installing the first fitting 241 around existing cables.

Figure 11:
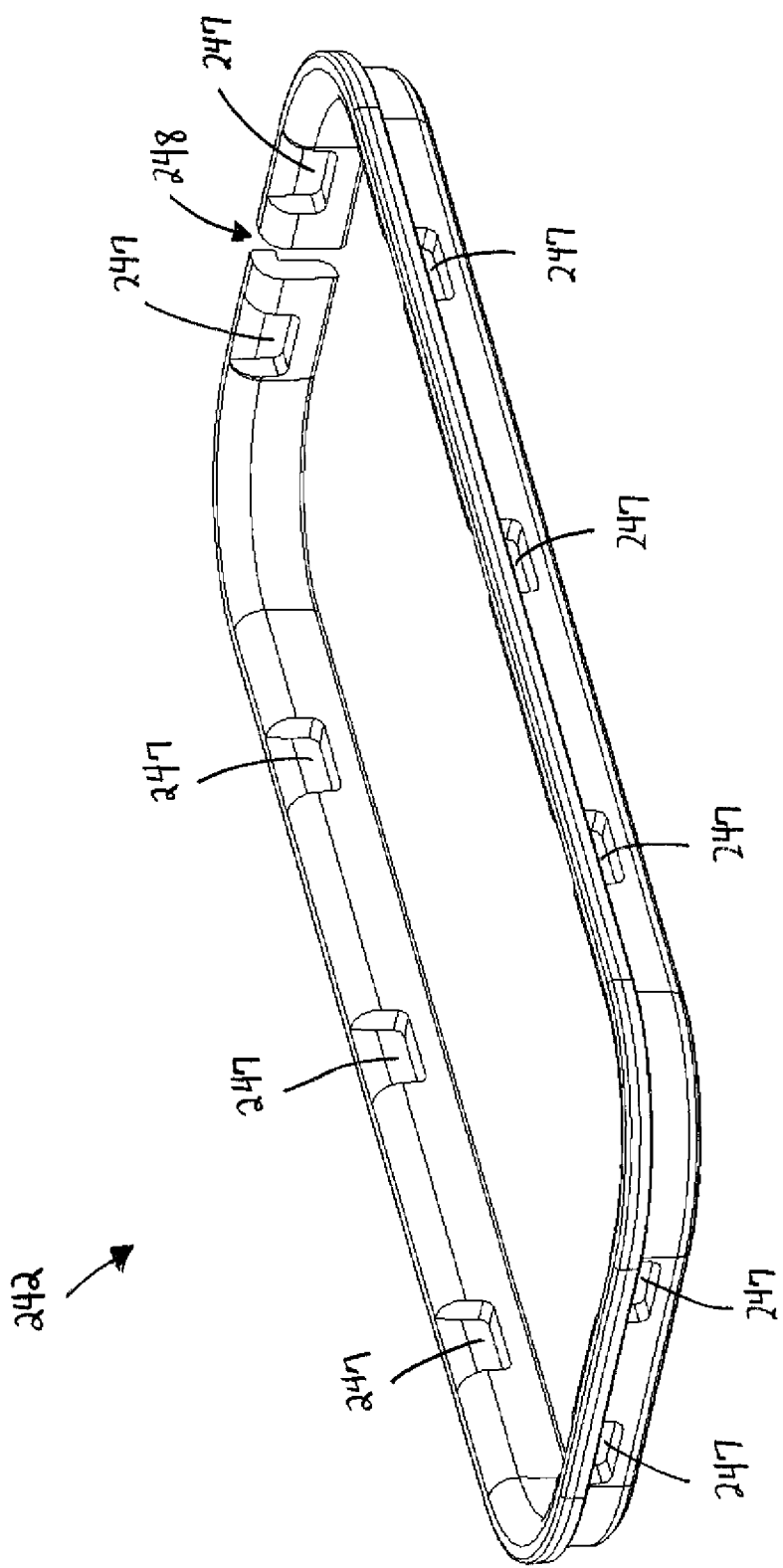
FIG. 11 is a top perspective view of a second fitting for the boot fitting assembly of FIG. 9.

As best seen in FIG. 11, the second fitting 242 includes openings 247 for securing the second fitting 242 to the first fitting 241. For example, as shown in FIG. 9, the latches 245 of the first fitting 241 are received within the openings 247 of the second fitting 242. Additionally, the second fitting 242 includes a split 248 for installing the second fitting 242 around existing cables.

Figure 12:
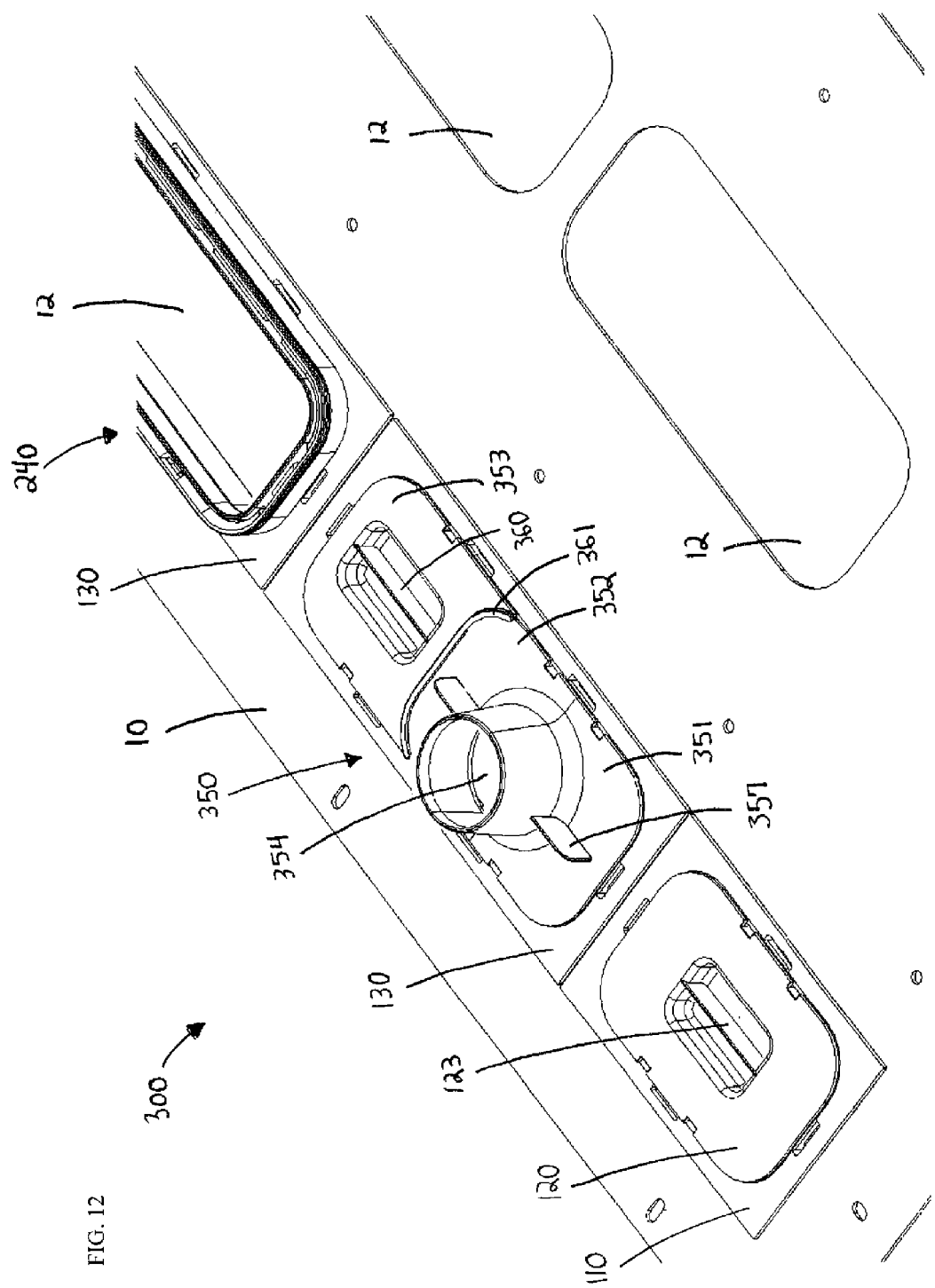
FIG. 12 is a top perspective view of a network cabinet fitting system according to a third preferred embodiment of the present invention.

FIGS. 12-18 illustrate a network cabinet fitting system 300 according to a third preferred embodiment of the present invention. As best seen in FIG. 12, the fitting system 300 includes the small grommet 110, the small cover 120, the large grommet 130, and the boot fitting assembly 240. Additionally, the fitting system 300 includes a corrugated tube fitting assembly 350. The corrugated tube fitting assembly 350 is secured to the large grommet 130 and includes a first fitting 351, a second fitting 352, and a partial cover 353. Together, the fittings 351, 352 form an opening 354 for receiving a corrugated tube 13 (FIGS. 16-18), for example, from a cable routing system, such as the FIBERRUNNER® cable routing system (Panduit Corp., Tinley Park, Ill.).

Figure 13:
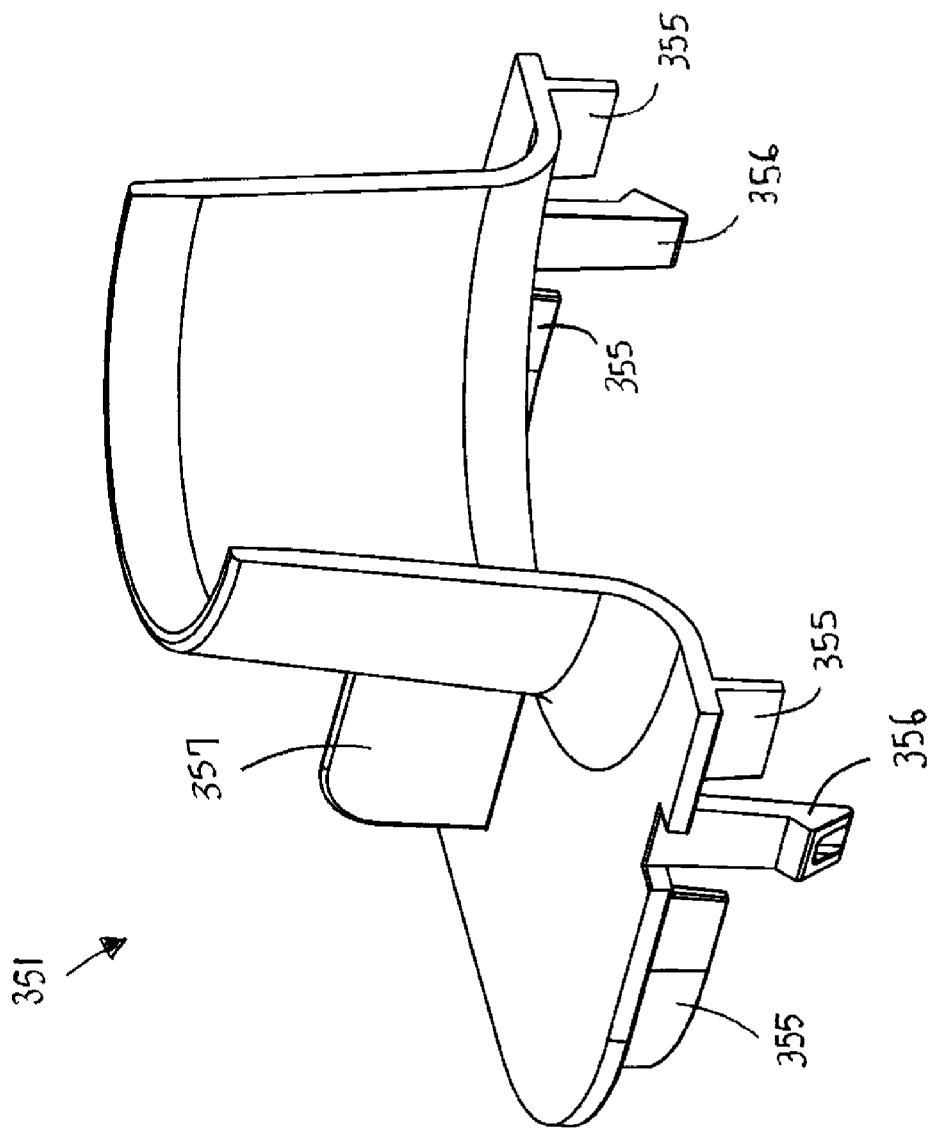
FIG. 13 is a top perspective view of a first fitting for the corrugated tube fitting assembly of FIG. 12.

As best seen in FIG. 13, the first fitting 351 includes guides 355, latches 356, and a finger lift 357, which are similar to the guides 121, the latches 122, and the finger lift 123 of the small cover 120 (FIGS. 5-6). Preferably, the first fitting 351 and the second fitting 352 are identical.

Figure 14:
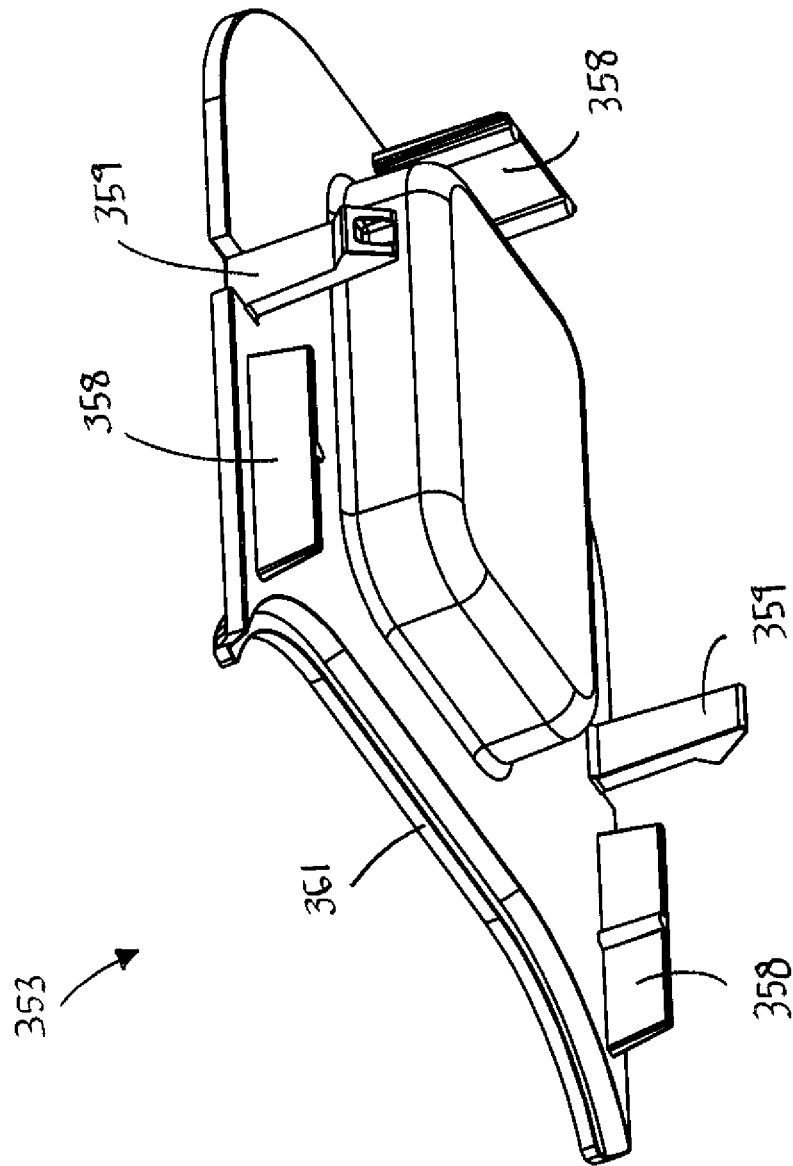
FIG. 14 is a bottom perspective view of a partial cover for the corrugated tube fitting assembly of FIG. 12.

As best seen in FIG. 14, the partial cover 353 includes guides 358, latches 359, and a finger lift 360 (FIG. 12), which are similar to the guides 121, the latches 122, and the finger lift 123 of the small cover 120 (FIGS. 5-6). Additionally, the partial cover 353 includes a lip 361 that overlaps the second fitting 352 and seals the gap between the partial cover 353 and the second fitting 352.

Figure 15:
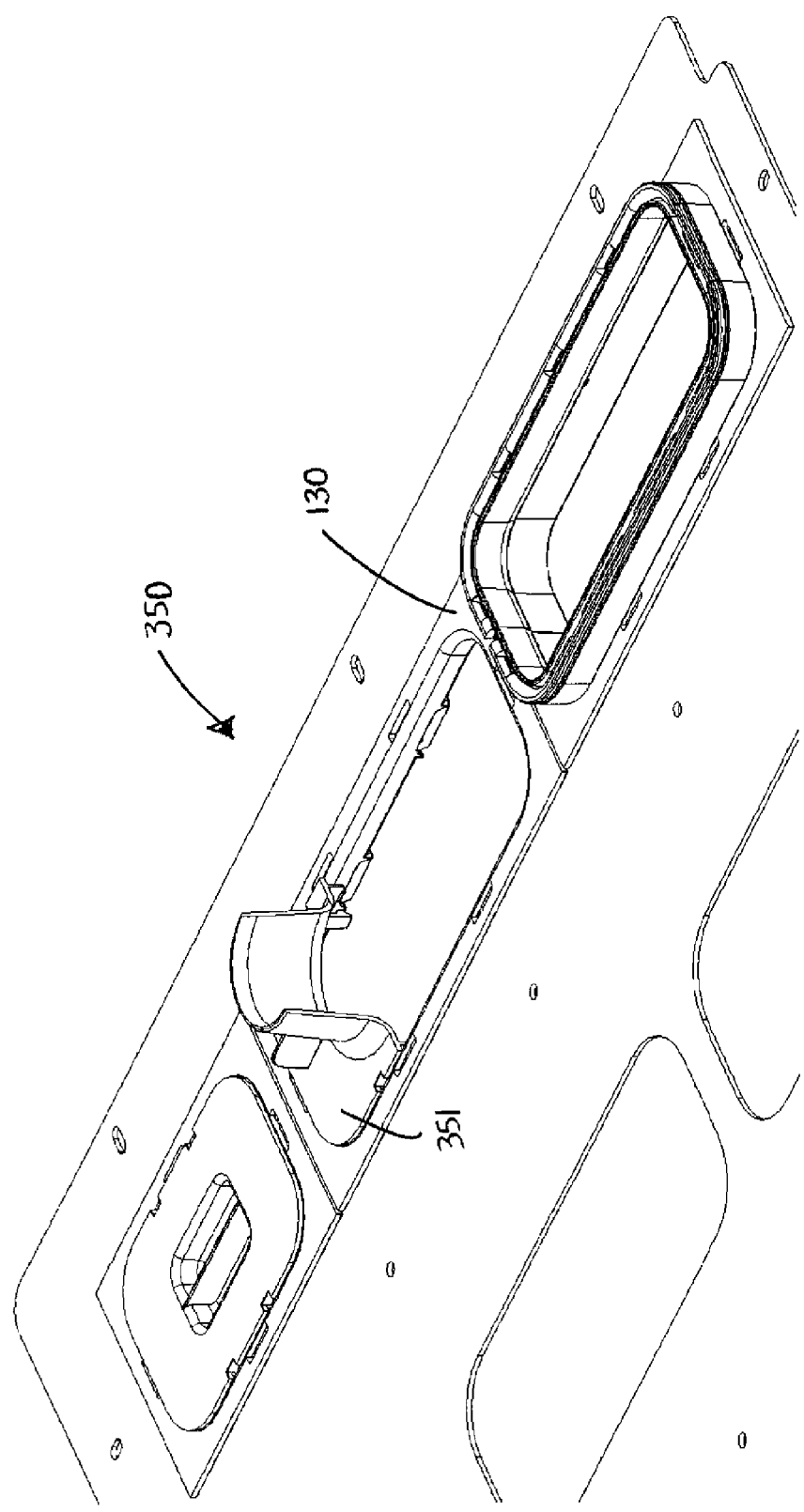
FIG. 15 is a top perspective view of the fitting system of FIG. 12, showing the first fitting secured to the large grommet.
Figure 16:
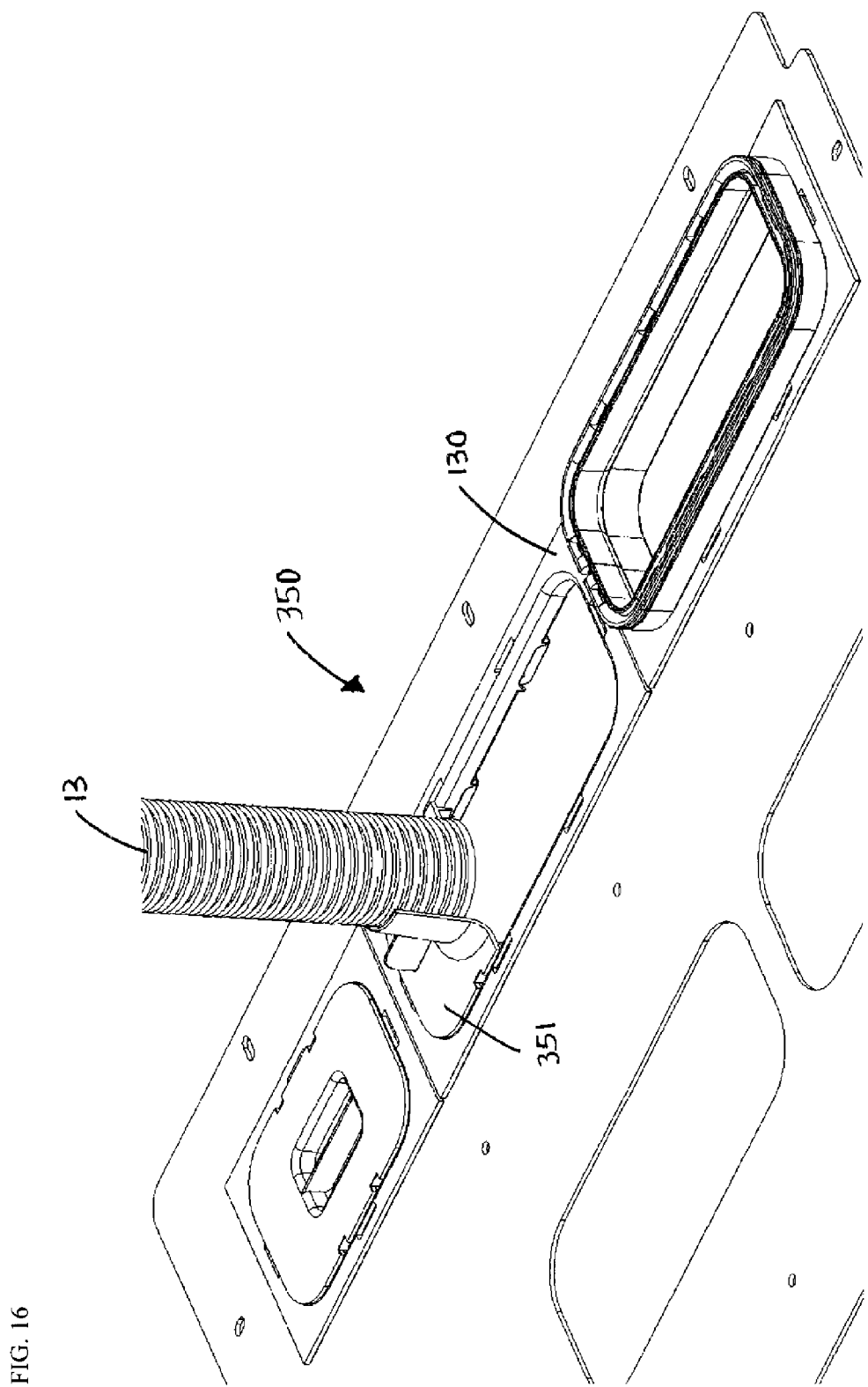
FIG. 16 is a top perspective view of the fitting system of FIG. 12, showing the corrugated tube positioned in the first fitting.
Figure 17:
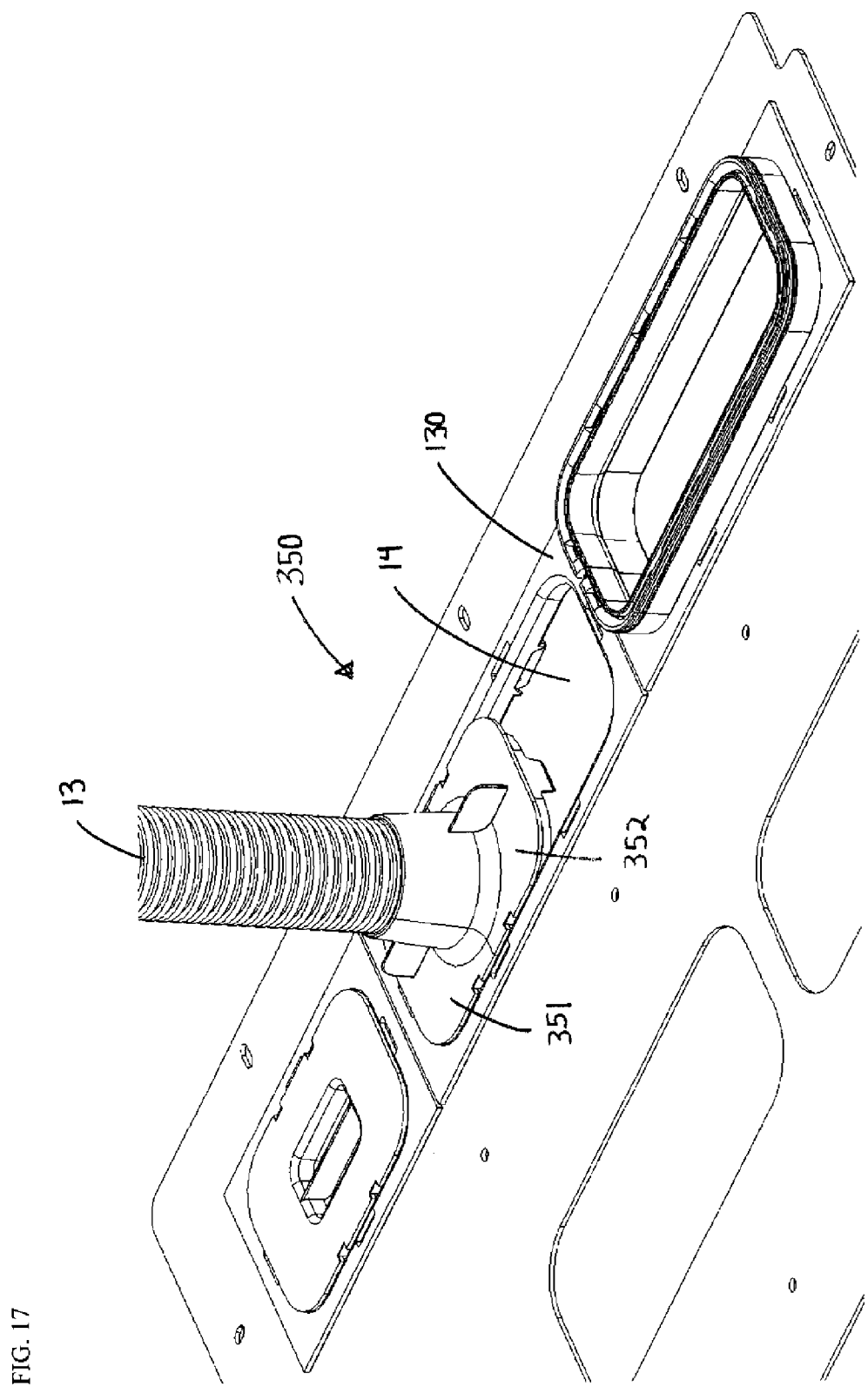
FIG. 17 is a top perspective view of the fitting system of FIG. 12, showing the second fitting secured to the large grommet.
Figure 18:
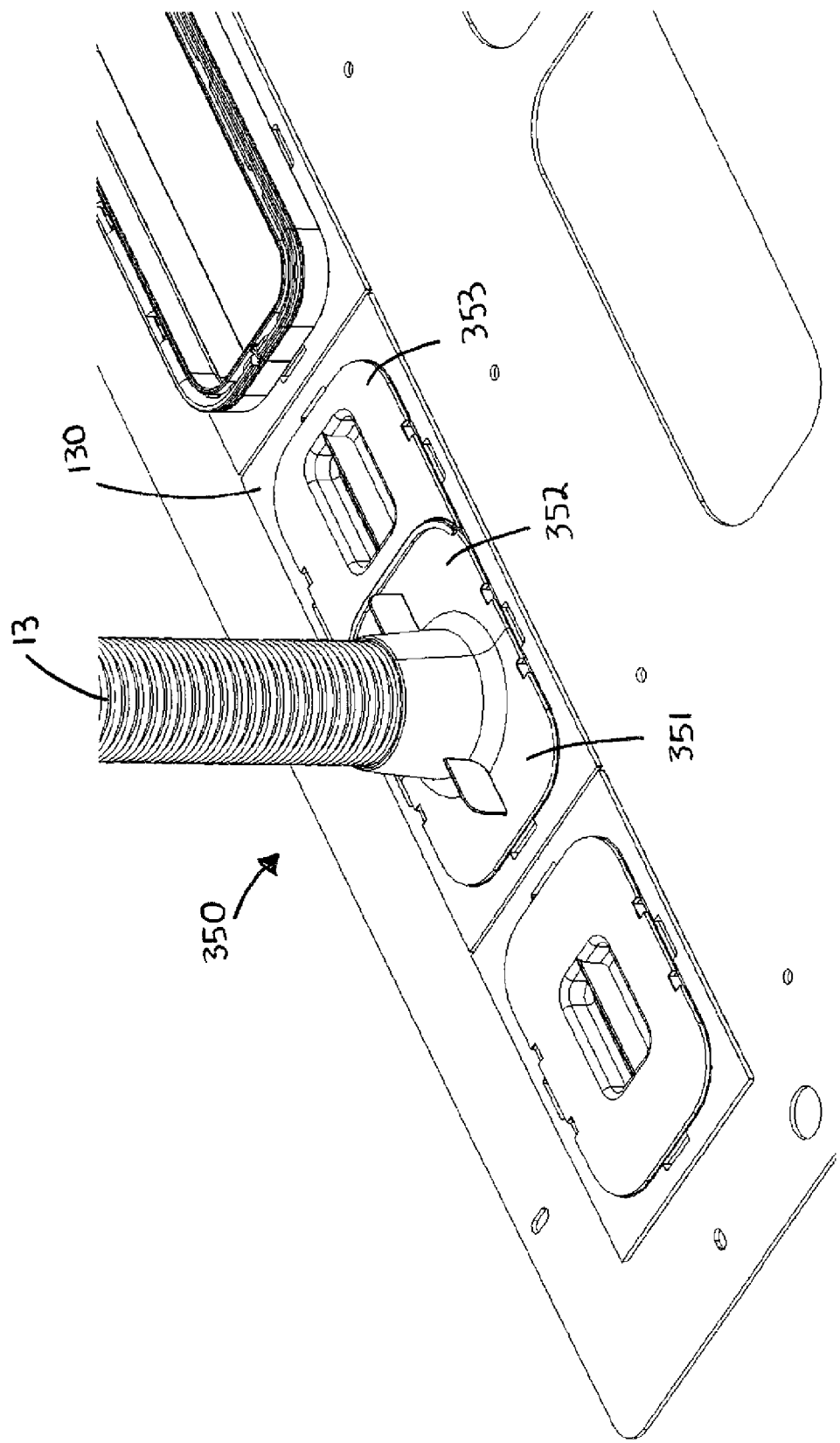
FIG. 18 is a top perspective view of the fitting system of FIG. 12, showing the partial cover secured to the large grommet.

FIGS. 15-18 illustrate the installation of the corrugated tube fitting assembly 350. As best seen in FIG. 15, the first fitting 351 is secured to the large grommet 130. As best seen in FIG. 16, the corrugated tube 13 is positioned in the first fitting 351. Preferably, the corrugated tube 13 includes a slit (not shown) for installing the corrugated tube 13 around existing cables. As best seen in FIG. 17, the second fitting 352 is secured to the large grommet 130, securing the corrugated tube 13 in the opening 354 (FIG. 12). As best seen in FIG. 18, the partial cover 353 is secured to the large grommet 130, sealing the remaining open space 14 (FIG. 17) in the large grommet 130. Alternatively, the corrugated tube fitting assembly 350 may be secured to the small grommet 110, eliminating the need for the partial cover 353.

Preferably, the components of the fitting systems 100-300, such as the small grommet 110, the small cover 120, the large grommet 130, the boot fitting assembly 240, and the corrugated tube fitting assembly 350, may be combined to form additional embodiments of the present invention.

Preferably, all of the openings 11, 12 in the top cap 10 include a grommet 110, 130 and at least one of a cover 120, 140, a boot fitting assembly 240, and a corrugated tube fitting assembly 350.

While the particular preferred embodiments of the present invention have been shown and described, it will be obvious to those skilled in the art that changes and modifications may be made without departing from the teaching of the invention. The matter set forth in the foregoing description and accompanying drawings is offered by way of illustration only and not as limitation. The illustrated embodiments are examples only and should not be taken as limiting the scope of the present invention. The claims should not be read as limited to the described order or elements unless stated to that effect. Therefore, all embodiments that come within the scope and spirit of the following claims and equivalents thereto are claimed as the invention.

The invention claimed is:

1. A fitting system for sealing a top cap opening in a network cabinet, the fitting system comprising:
   a grommet removably connected to the top cap opening;
   a fitting assembly removably connected to the grommet, the fitting assembly including a fitting assembly opening and at least one fitting assembly finger lift for removing the fitting assembly from the grommet;
   a corrugated tube removably connected to the fitting assembly opening, the corrugated tube defining a cable pathway through the fitting assembly; and
   a partial cover removably connected to the grommet adjacent to and independent of the fitting assembly.

2. The fitting system of claim 1, wherein the grommet includes at least one guide for positioning the grommet in the top cap opening.

3. The fitting system of claim 1, wherein the grommet includes at least one latch for securing the grommet to the top cap opening.

4. The fitting system of claim 1, wherein the grommet includes at least one stop for positioning the fitting assembly in the grommet.

5. The fitting system of claim 1, wherein the fitting assembly includes a first fitting removable connected to the grommet and a second fitting removably connected to the grommet.

6. The fitting system of claim 5, wherein the first fitting and the second fitting are identical.

7. The fitting system of claim 5, wherein the first fitting and the second fitting form the fitting assembly opening.

8. The fitting system of claim 5, wherein the first fitting includes at least one first fitting guide for positioning the first fitting in the grommet.

9. The fitting system of claim 5, wherein the first fitting includes at least one first fitting latch for securing the first fitting to the grommet.

10. The fitting system of claim 5, wherein the first fitting includes at least one first fitting finger lift for removing the first fitting from the grommet.

11. The fitting system of claim 8, wherein the second fitting includes at least one second fitting guide for positioning the second fitting in the grommet.

12. The fitting system of claim 9, wherein the second fitting includes at least one second fitting latch for securing the second fitting to the grommet.

13. The fitting system of claim 10, wherein the second fitting includes at least one second fitting finger lift for removing the second fitting from the grommet.

14. The fitting system of claim 1, wherein the partial cover includes a lip that overlaps a portion of the fitting assembly such that the partial cover further secures the fitting assembly to the grommet.

15. The fitting system of claim 1, wherein the partial cover includes at least one guide for positioning the partial cover in the grommet.

16. The fitting system of claim 1, wherein the partial cover includes at least one latch for securing the partial cover to the grommet.

17. The fitting system of claim 1, wherein the partial cover includes at least one partial cover finger lift for removing the partial cover from the grommet.

18. The fitting system of claim 17, wherein the at least one partial cover finger lift is recessed.

* * * * *